US007649519B2

(12) United States Patent
Seo et al.

(10) Patent No.: US 7,649,519 B2
(45) Date of Patent: Jan. 19, 2010

(54) SOURCE DRIVERS HAVING CONTROLLABLE OUTPUT CURRENTS AND RELATED DISPLAY DEVICES AND METHODS

(75) Inventors: Myung-Ho Seo, Gyeonggi-do (KR); Hyun-Sang Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 608 days.

(21) Appl. No.: 11/400,604

(22) Filed: Apr. 7, 2006

(65) Prior Publication Data

US 2007/0115271 A1 May 24, 2007

(30) Foreign Application Priority Data

Nov. 23, 2005 (KR) ...................... 10-2005-0112194

(51) Int. Cl.
*G06F 3/038* (2006.01)
*H03B 1/00* (2006.01)

(52) U.S. Cl. .......................... 345/98; 345/100; 327/108

(58) Field of Classification Search ................. 345/204, 345/98, 100; 327/108
See application file for complete search history.

(56) References Cited

U.S. PATENT DOCUMENTS 6,567,327 B2 5/2003 Tsuchi
2002/0109525 A1* 8/2002 Shin ............................ 326/26
2002/0163367 A1* 11/2002 Murata ....................... 327/115
2004/0145397 A1* 7/2004 Lutkemeyer ................ 327/158
2006/0220720 A1* 10/2006 Freyman et al. ............. 327/247

FOREIGN PATENT DOCUMENTS

JP 2000-148101 A 5/2000
JP 2002-006810 A 1/2002

* cited by examiner

*Primary Examiner*—Amr Awad
*Assistant Examiner*—Jonathan Boyd
(74) *Attorney, Agent, or Firm*—Myers Bigel Sibley & Sajovec

(57) ABSTRACT

Source drivers and display devices that include such source drivers are provided that may be used to control the amount of output current from an output buffer. These source drivers may comprise a buffer that is configured to receive an input signal and a control circuit that is coupled to the buffer that is configured to control an output current level of the buffer. The control circuit may comprise a bias voltage generator that is configured to generate a plurality of bias voltages, and the output current level of the buffer may be controlled based on the plurality of bias voltages. Methods of controlling the amount of current output from an output buffer of the source driver and methods of driving a display device are also provided.

10 Claims, 13 Drawing Sheets

SOURCE DRIVERS HAVING CONTROLLABLE OUTPUT CURRENTS AND RELATED DISPLAY DEVICES AND METHODS

CROSS-REFERENCE TO RELATED PATENT APPLICATION

This application claims priority under 35 U.S.C. § 119 from Korean Patent Application No. 2005-0112194, filed on Nov. 23, 2005, the disclosure of which is hereby incorporated by reference herein as if set forth in its entirety.

FIELD OF THE INVENTION

The present invention relates to semiconductor devices and, more particularly, to source drivers and related display devices and methods.

BACKGROUND

As display panels get bigger, the amount of current running through the source driver that drives the display panel is increased. As the amount of current increases, so does the amount of heat generated by the source driver.

FIG. 1 is a block diagram of a conventional prior art display device 10. As shown in FIG. 1, the display device 10 comprises a display panel 20, a data line driver (or source driver) 30, a scan line driver (or gate driver) 50 and a controller 60. The display panel 20 further includes a plurality of source lines S1, S2, . . . Sn, a plurality of gate lines G1, G2, . . . Gm and a plurality of pixel electrodes (not shown in FIG. 1).

The source driver 30 drives the source lines (or data lines) S1, S2, . . . Sn of the display panel 20 based on digital image data DATA that is output from the controller 60. The source driver 30 may comprise, for example, a shift register (not shown in FIG. 1), a line latch (not shown in FIG. 1), a digital-to-analog converter 31 and an output buffer array 32.

The digital-to-analog converter 31 generates a plurality of analog voltages IN1, IN2, . . . INn in response to the digital image data DATA. The output buffer array 32 buffers the analog voltages output from the digital-to-analog converter 31, and outputs corresponding analog voltages to the source lines S1, S2, . . . Sn. The output buffer array 32 comprises a plurality of output buffers 33, 34, . . . 35, each of which buffers a corresponding analog voltage output from the digital-to-analog converter 31 and outputs the buffered analog voltage to a corresponding source line S1, S2, . . . Sn.

The gate driver 50 sequentially drives the gate lines (or scan lines) G1, G2, . . . Gm of the display panel 20 under control of the controller 60. The controller 60 controls the operation of the source driver 30 and the gate driver 50. The controller 60 may be under the control of a host computer.

FIG. 2 is a circuit diagram of one of the output buffers (output buffer 33) of FIG. 1. FIG. 3 is a timing diagram of the input/output signals of the output buffer 33 shown in FIG. 2. Referring to FIGS. 1-3, the first switching signal SW and the second switching signal CS are predetermined switching signals generated in the source driver 30. AMP_OUT is the output voltage of a unit gain buffer 41, and OPSC is the static current consumed in the output buffer 33. TCR is the total current consumed in the output buffer 33, and TPW is the total power consumed in the output buffer 33.

Generally, the output voltage OUT of the output buffer 33 in the source driver 30 is output synchronously with the first clock signal CLK1 (see FIG. 3). During the high cycle of the first clock signal CLK1, the output voltage OUT of the output buffer 33 is supplied to the source line S1 of the display panel 20 or during the low cycle of the first clock signal CLK1, the output voltage OUT of the output buffer 33 is supplied to the source line S1 of the display panel 20. As shown in FIGS. 2-3, during the high cycle of the first clock signal CLK1, a first transmission gate 42 is off in response to a first switching signal SW and a second transmission gate 43 is on in response to a second switching signal CS. As such, the output terminals of the output buffers 33, 34, . . . 35 are connected to each other through the second transmission gate 43. Consequently, the output terminals of the output buffers 33, 34, . . . 35 share a load (not shown) that is connected to the source lines. Thus, the high duration of the first clock signal CLK1 is called a charge sharing region CSR.

During the low cycle of the first clock signal CLK1, the first transmission gate 42 is on in response to the first switching signal SW, and the second transmission gate 43 is off in response to the second switching signal CS. As a result, each of the output buffers 33, 34, . . . 35 has characteristics corresponding to specification and charges the load connected to the source lines of the display panel 20 with a prescribed amount of charge.

As shown in FIG. 3, the output buffer 33 rapidly charges the load connected to the source line S1 of the display panel 20 with a predetermined amount of charge in an operating region OR. Once the load is sufficiently charged, the output buffer 33 charges the load with a small amount of charge in a standby region SR. Herein, the operating region OR refers to the region in which the load is rapidly charged with the output charge from the output buffer 33, and the standby region SR refers to the region in which the output buffer 33 charges the load with only a small amount of charge, or maintains the charged level of the load at a desired level.

SUMMARY

Pursuant to certain embodiments of the present invention, source drivers are provided that may be used to control the amount of output current from an output buffer. These source drivers may comprise a buffer that is configured to receive an input signal and a control circuit that is coupled to the buffer that is configured to control an output current level of the buffer. In some embodiments, the control circuit may comprise a bias voltage generator that is configured to generate a plurality of bias voltages. In such embodiments, the output current level of the buffer may be controlled based on the plurality of bias voltages. The plurality of bias voltages may be generated by the bias voltage generator in response to a first control signal and a second control signal.

In some embodiments, the control circuit may set the output current level of the buffer to different levels in at least two, or all three, of a charge sharing region, an operating region and a standby region of the driving cycle of the source driver.

In some embodiments, the output current level of the buffer when the first control signal is a first logic state and the second control signal is the first logic state is lower than the output current level of the buffer when the first control signal is a second logic state and the second control signal is the first logic state. Likewise, the output current level of the buffer when the first control signal is the second logic state and the second control signal is the first logic state is lower than the output current level of the buffer when the first control signal is the second logic state and the second control signal is the second logic state.

In some embodiments, the buffer may be implemented as a pull-up transistor that is connected to a first reference voltage and an output terminal of the buffer and a pull-down transistor that is connected between the output terminal of the buffer and a second reference voltage. In such embodiments, the current driving ability of the pull-up transistor may be controlled by the bias voltages of a first subset of the plurality of bias voltages and the current driving ability of the pull-down transistor may be controlled by the bias voltages of a second subset of the plurality of bias voltages.

In some embodiments, the control circuit may further include a first control signal generating circuit that is configured to generate the first control signal based on a first clock signal and a delay signal that delays the clock signal for a predetermined time and a second control signal generating circuit that is configured to generate the second control signal based on the first clock signal and a second clock signal. The first control signal generating circuit may be implemented, for example, as a delay circuit that is configured to receive the first clock signal and output the delay signal, an inverter that is coupled to the output of the delay circuit and a NAND circuit that is configured to perform a NAND operation on the first clock signal and an output signal of the inverter to generate the first control signal. The second control signal generating circuit may be implemented, for example, as a counter that is configured to count cycles of the second clock signal and an OR circuit that is configured to perform an OR operation on the first clock signal and an output signal of the counter to generate the second control signal. The frequency of the first clock signal may be lower than the frequency of the second clock signal.

Pursuant to further embodiments of the present invention, display devices are provided that comprise (1) a display panel that includes a plurality of source lines and a plurality of gate lines, (2) a source driver that is configured to drive the plurality of source lines and (3) a controller that is configured to control the operation of the source driver. In these display panels, the source driver may comprise a bias voltage generator that is configured to generate a plurality of bias voltages in response to a first control signal and a second control signal and a plurality of buffers that are each configured to buffer a respective one of a plurality of input signals based on the plurality of bias voltages and to output a signal according to the result of the buffering to a corresponding one of the plurality of source lines. The output current level of each of the plurality of buffers may be controlled based on the plurality of bias voltages.

In these display devices, each of the plurality of buffers may comprise a pull-up transistor that is connected to a first reference voltage and an output terminal of the buffer and a pull-down transistor that is connected between the output terminal of the buffer and a second reference voltage. The current driving ability of the pull-up transistor may be controlled by the bias voltages of a first subset of the plurality of bias voltages and the current driving ability of the pull-down transistor may be controlled by the bias voltages of a second subset of the plurality of bias voltages.

In some embodiments, the first control signal and the second control signal may be output from the controller. In other embodiments, the source driver may further include a control signal generating circuit that is responsive to a first clock signal and a second clock signal output from the controller, and the first control signal and the second control signal may be generated by the control signal generating circuit. In these embodiments, the control signal generating circuit may be implemented, for example, as a first control signal generating circuit that is configured to generate the first control signal based on the first clock signal and a delay signal that delays the clock signal for a predetermined time and a second control signal generating circuit that is configured to generate the second control signal based on the first clock signal and the second clock signal.

Pursuant to further embodiments of the present invention, methods for controlling an amount of output current from an output buffer of a source driver are provided. Pursuant to these methods, a plurality of bias voltages are generated, where the level of each of the plurality of bias voltages is controlled in response to a first control signal and a second control signal. An input signal generated from image data is buffered based on the plurality of bias voltages. Additionally, the amount of output current from the output buffer is controlled based on the plurality of bias voltages.

Pursuant to additional embodiments of the present invention, methods of driving a display device are provided. Pursuant to these methods, a first amount of current is output from an output buffer of a source driver onto a source line during a first time period. A second amount of current is output from the output buffer onto the source line during a second time period, where the second amount of current exceeds the first amount of current. The first amount of current may be output, for example, during a charge sharing period, and the second amount of current may be output, for example, during a period when the source line charges a load in the display device. The methods may further include reducing the amount of current output from the output buffer during a third time period that immediately follows the second time period. The third time period may be a time period where the source line continues to charge the load in the display device.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", "on" versus "directly on", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 4:
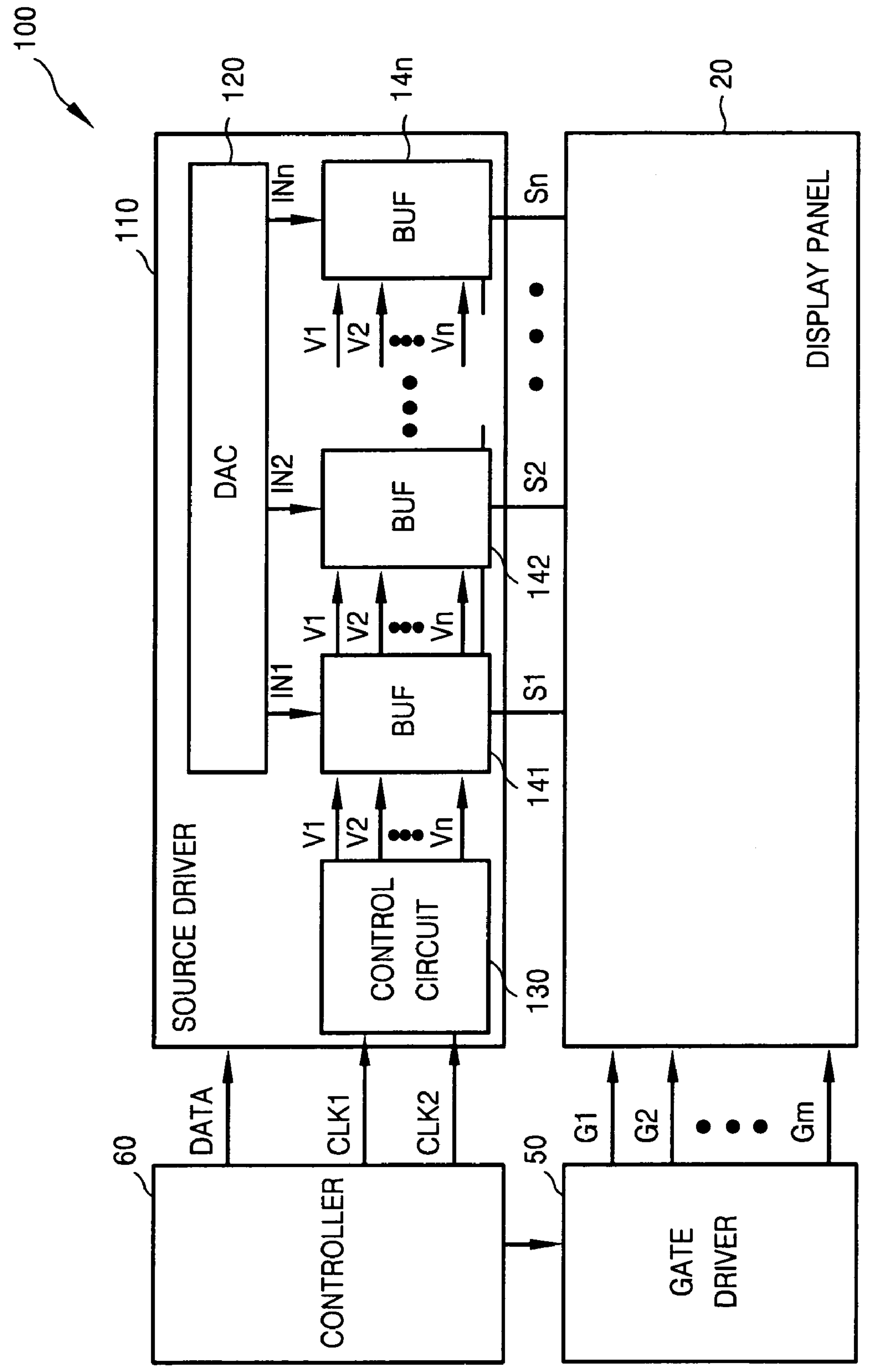
FIG. 4 is a block diagram of a display device according to embodiments of the present invention.

FIG. 4 is a block diagram of a display device 100 according to some embodiments of the present invention. As shown in FIG. 4, the display device 100 comprises a display panel 20, a source driver 110, a gate driver 50 and a controller 60.

The source driver 110 comprises a digital-to-analog converter 120, a control circuit 130 and a plurality of output buffers 141, 142, . . . **14*n*. The source driver 110 may also include additional elements (e.g., a shift register, a line latch, etc.) that are not shown in FIG. 4**.

The control circuit 130 generates a plurality of bias voltages V1, V2, . . . Vn, in which "n" is a natural number, in response to a first clock signal CLK1 and a second clock signal CLK2 that are output from the controller 60. The first clock signal CLK1 may be a horizontal period applied to the source driver 110 from the controller 60 and the second clock signal CLK2 may be a data clock signal applied to the source driver 110 from the controller 60. The first clock signal CLK1 may have a frequency lower than the frequency of the second clock signal CLK2.

Each of the plurality of output buffers 141, 142, . . . **14*n* buffers a corresponding input signal IN1, IN2, . . . INn, based on the plurality of bias voltages V1, V2, . . . Vn, and drives the buffered voltage to a corresponding source line S1, S2, . . . Sn. The input signals IN1, IN2, . . . INn, in which n is a natural number, are output signals of the digital-to-analog converter 31. The plurality of output buffers 141, 142, . . . 14*n*** may comprise, by way of non-limiting examples, unit gain buffers or operational amplifiers.

Figure 5:
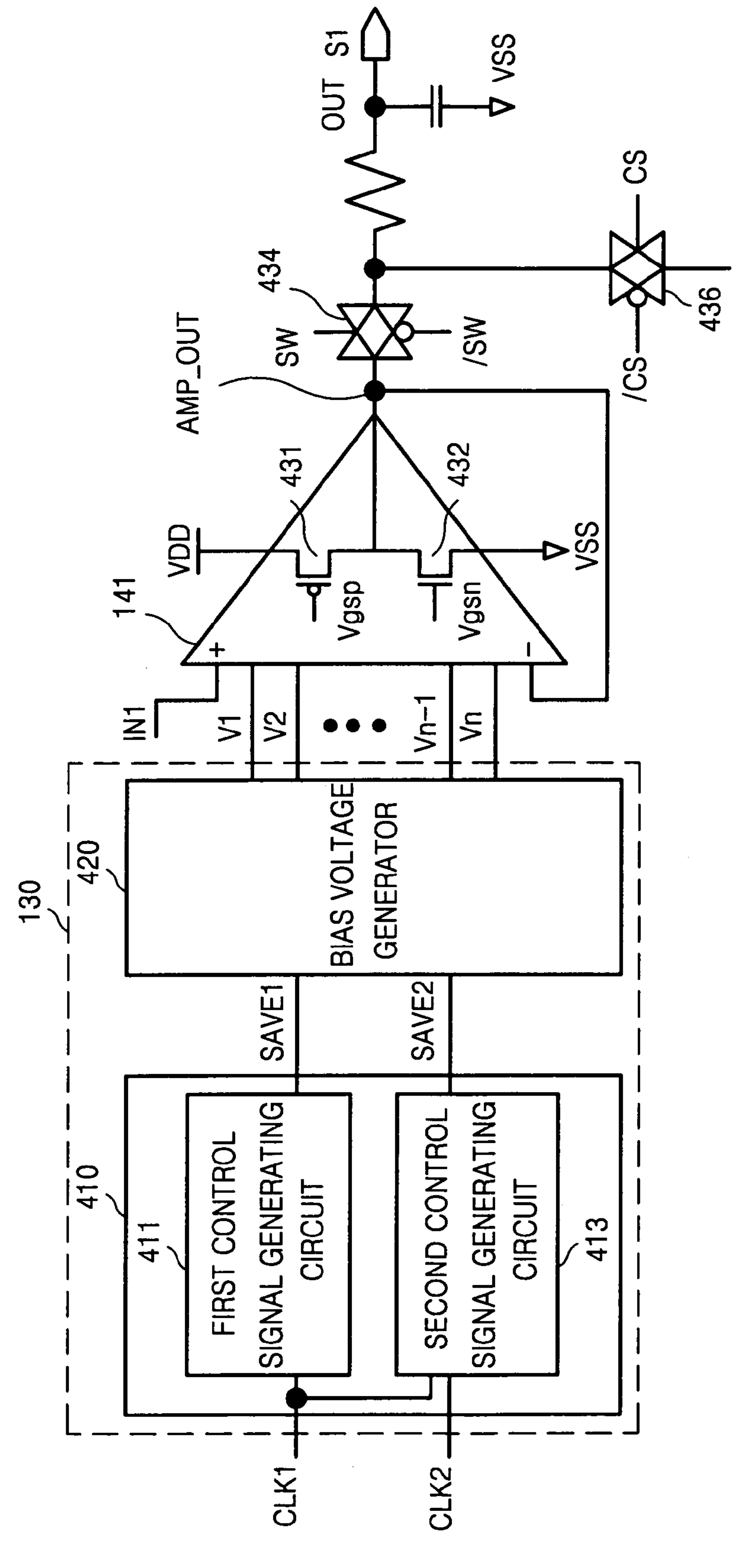
FIG. 5 is a circuit diagram of the control circuit and the output buffer of the display device of FIG. 4 according to certain embodiments of the present invention.
Figure 6:
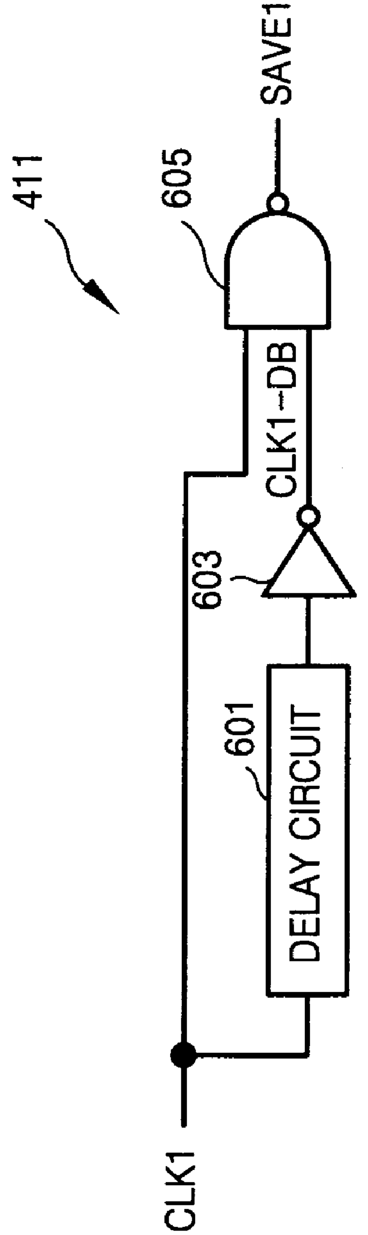
FIG. 6 is a circuit diagram of the first control signal generating circuit of FIG. 5 according to certain embodiments of the present invention.
Figure 8:
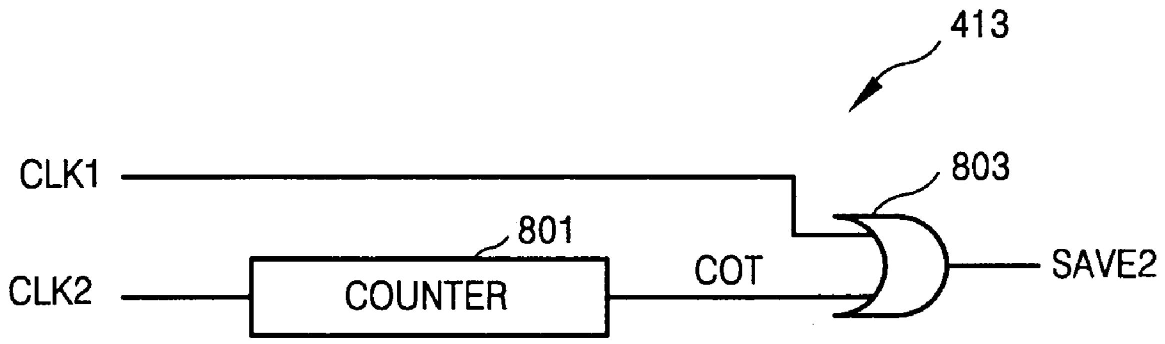
FIG. 8 is a circuit diagram of the second control signal generating circuit of FIG. 5 according to certain embodiments of the present invention.

FIG. 5 is a circuit diagram of the control circuit 130 and one of the output buffers (output buffer 141) of FIG. 4 according to certain embodiments of the present invention. FIG. 6 is a circuit diagram of the first control signal generating circuit 411 of FIG. 5 according to certain embodiments of the present invention. FIG. 8 is a circuit diagram of the second control signal generating circuit 413 of FIG. 5 according to certain embodiments of the present invention.

Referring to FIGS. 5-8, the control circuit 130 may be implemented, for example, as a control signal generating circuit 410 and a bias voltage generator 420. The control signal generating circuit 410 may generate a first control signal SAVE1 and a second control signal SAVE2 in response to a first clock signal CLK1 and a second clock signal CLK2.

Figure 7:
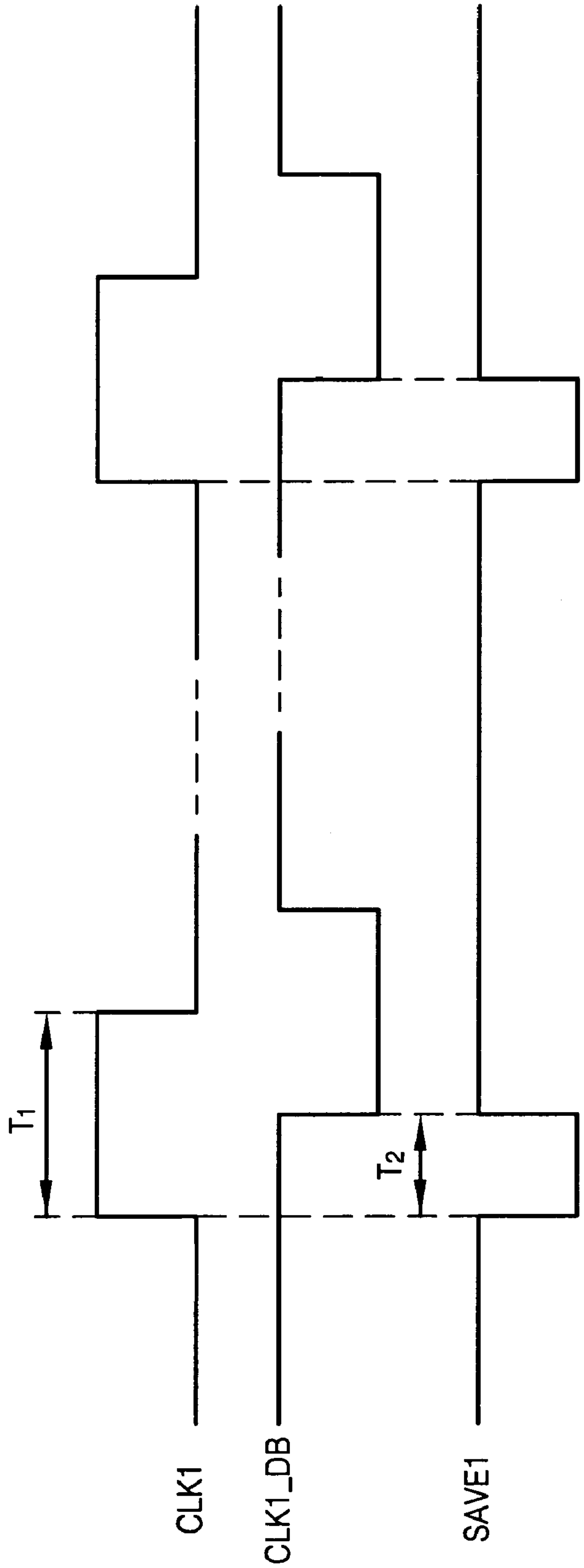
FIG. 7 is a timing diagram of the input/output signals of the first control signal generating circuit of FIG. 6 according to certain embodiments of the present invention.

As shown in FIG. 6, the first control signal generating circuit 411 may be implemented as a delay circuit 601, an inverter 603 and a NAND circuit (or NAND gate) 605. The delay circuit 601 delays the first clock signal CLK1 for a given time, the inverter 603 inverses the output signal of the delay circuit 601 and the NAND circuit 605 performs a NAND operation on the first clock signal CLK1 and the output signal CLK1-DB of the inverter 603 to generate the first control signal SAVE1. FIG. 7 is a timing diagram of the input/output signals of the first control signal generating circuit 411. As shown in FIG. 7, the low duration of the first control signal SAVE 1 may have a width T2 which may be half of the width T1 of the high duration of the first clock signal CLK1.

As shown in FIG. 8, the second control signal generating circuit 413 may be implemented, for example, as a counter 801 and an OR circuit (or OR gate) 803. The counter 801 counts cycles of the second clock signal CLK2 and outputs a signal COT according to the result of the counting. The OR circuit 803 performs an OR operation on the first clock signal CLK1 and the output signal COT from the counter 801 to generate the second control signal SAVE2.

Figure 9:
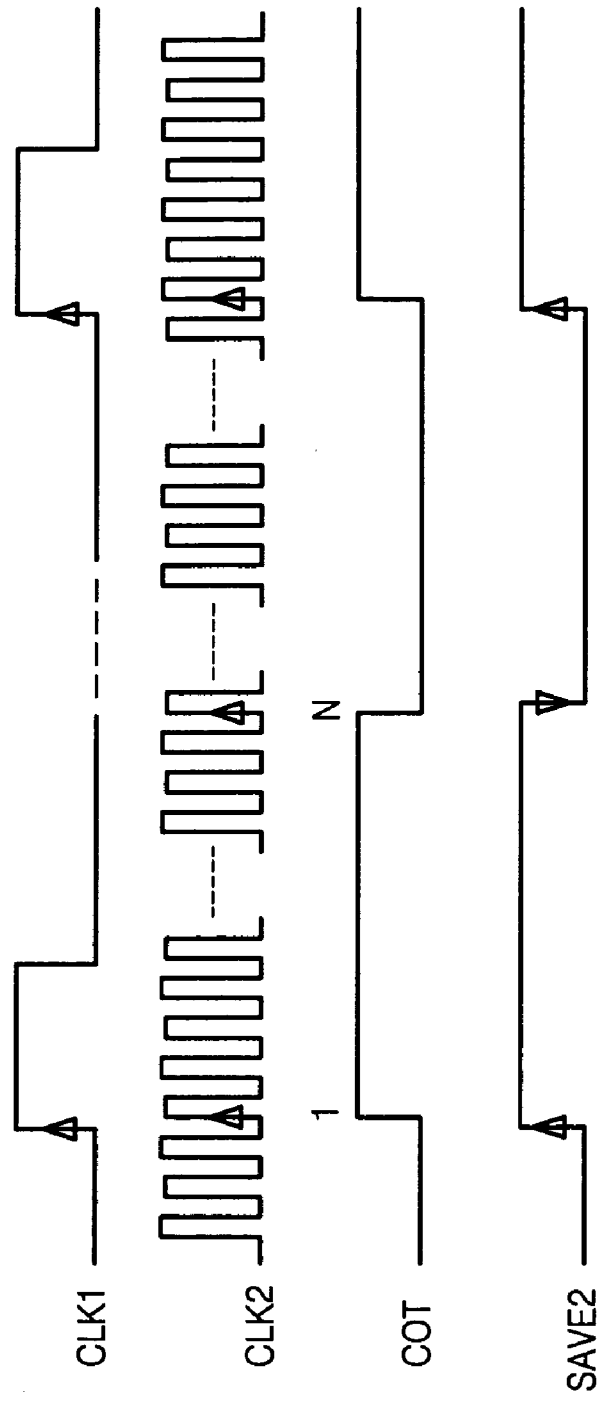
FIG. 9 is a timing diagram of the input/output signals of the second control signal generating circuit of FIG. 8 according to certain embodiments of the present invention.
Figure 12:
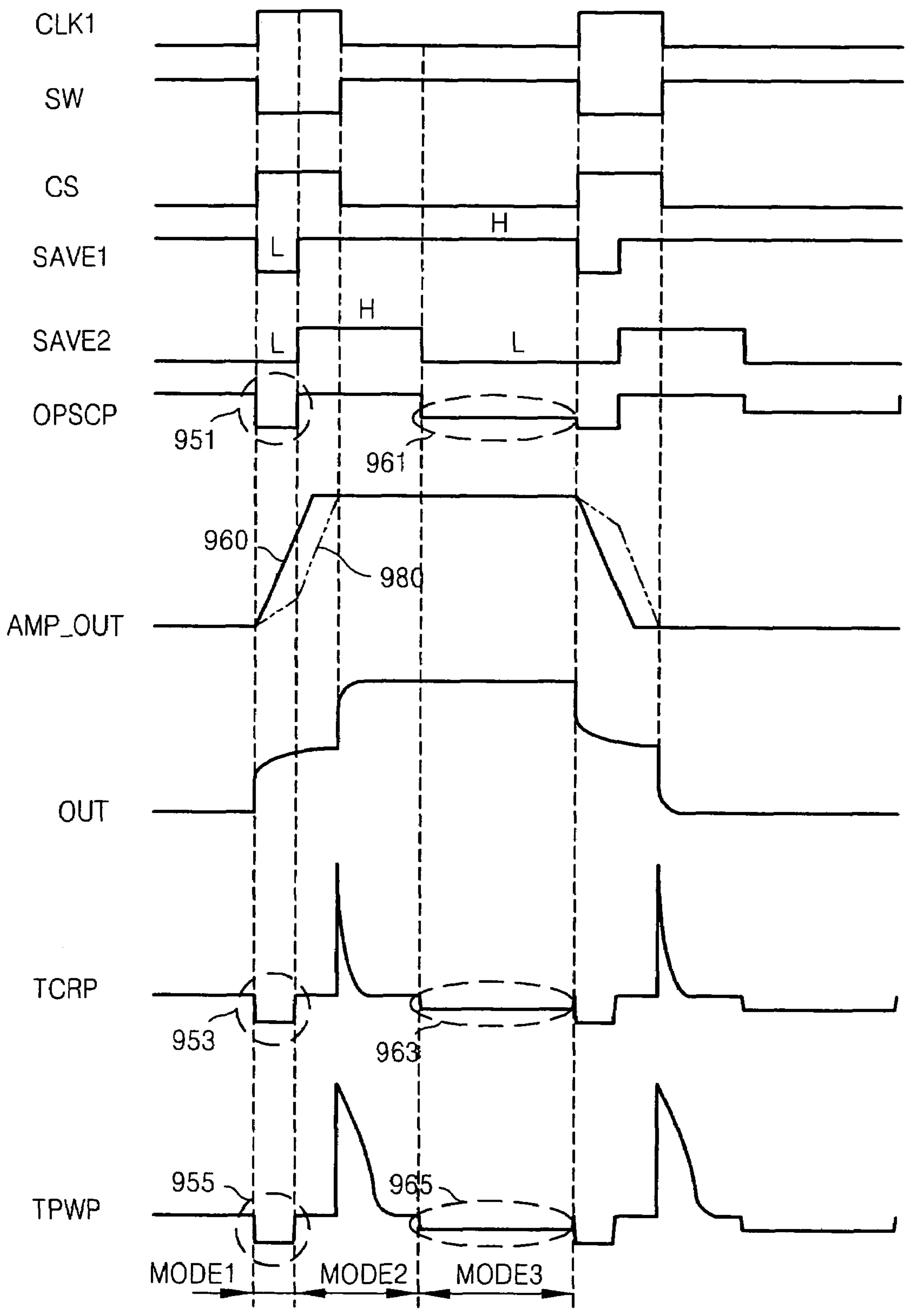
FIG. 12 is a timing diagram of the input/output signals of the control circuit and the output buffer of FIG. 5 according to certain embodiments of the present invention.

FIG. 9 is a timing diagram of the input/output signals of the second control signal generating circuit of FIG. 8. As shown in FIGS. 8 and 9, the counter 801 counts N cycles of the second clock signal CLK2 and outputs the signal COT which has a high duration for N clock cycles. Pursuant to some embodiments of the present invention, the point '1' where the signal COT transitions to a high level is a point at which the second clock signal CLK2 first senses the first clock signal CLK1 having a high level and 'N' represents a half point of the cycle of the first clock signal CLK1. The waveform of the first control signal SAVE 1 and the waveform of the second control signal SAVE2 according to certain embodiments of the present invention are shown in FIG. 12.

Figure 10:
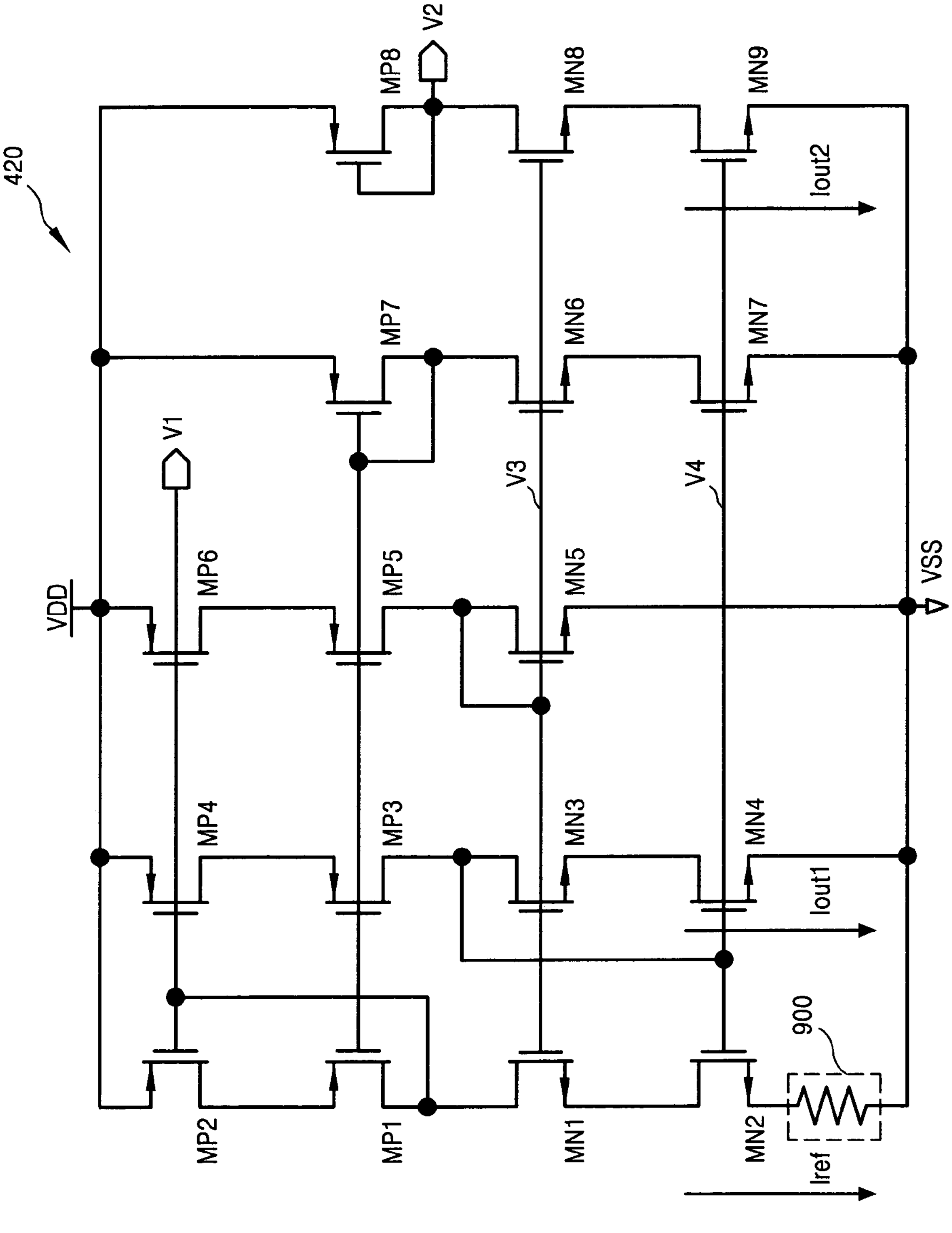
FIG. 10 is a circuit diagram of the bias voltage generator of FIG. 5 according to certain embodiments of the present invention.
Figure 11:
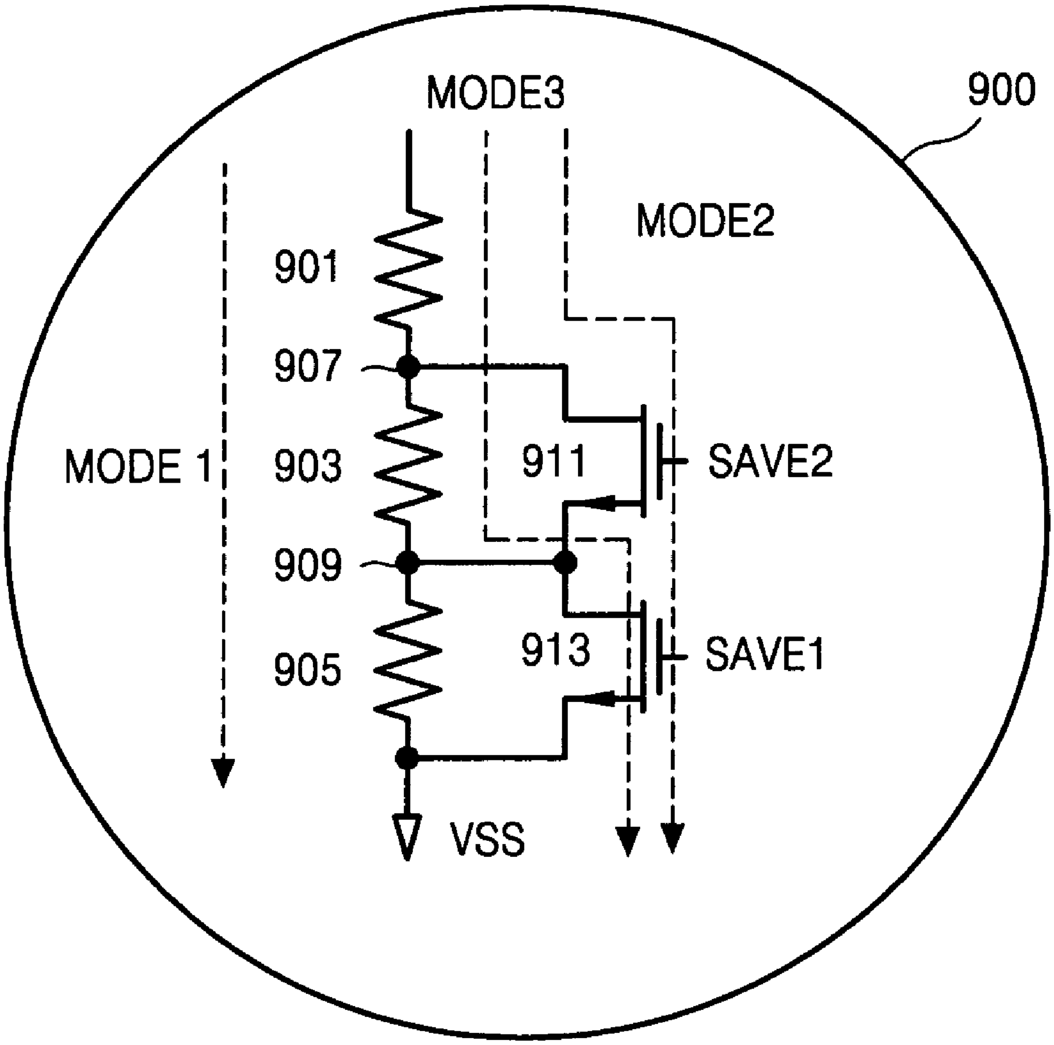
FIG. 11 is a schematic circuit diagram of the resistive circuit of FIG. 10 according to certain embodiments of the present invention.

FIG. 10 is a circuit diagram of an exemplary embodiment of the bias voltage generator 420 of FIG. 5 according to certain embodiments of the present invention. FIG. 11 is a schematic circuit diagram of an embodiment of the resistive circuit 900 of FIG. 10. As is apparent from FIG. 11, the resistance of the resistive circuit 900 is a function of the first and second control signals SAVE1 and SAVE2. Referring to FIG. 10, if the resistance of the resistive circuit 900 is increased, the reference input current Iref flowing through the resistive circuit 900 will decrease, as the current is inversely proportional to the resistance.

As is also shown in FIG. 10, the reduced reference current Iref is copied (or mirrored) to a first current Iout1 by a current mirror formed of transistors MP1, MP2, MP3 and MP4. Therefore, in order to generate the first current Iout1, the gate voltage V1 of the transistor MP4 (which controls the gate voltage of the PMOS transistor 431 of output buffer 141) increases while the gate voltage V4 of the transistor MN4 and the gate voltage V3 of the transistor MN3 (which controls the gate voltage of the NMOS transistor 432 of output buffer 141) decreases. Additionally, the first current Iout1 is copied to a second current Iout2 by a current mirror formed of transistors MN3 and MN4. Therefore, the voltage V2 of the transistor MP8 (which controls the gate voltage of the PMOS transistor 431 of output buffer 141) also increases.

Thus, when the resistance of the resistive circuit 900 increases in response to the first control signal SAVE1 and the second control signal SAVE2, the bias voltages V1 and V2 increase and the bias voltages V3 and V4 decrease. The increase in the bias voltages V1 and V2 increases the gate voltage Vgsp of the PMOS transistor 431 in the output buffer 141 (see FIG. 5), whereby the output current output from the output buffer 141 decreases. Accordingly, the current driving ability of the PMOS transistor 431 is reduced. The bias voltages V3 and V4 decrease the gate voltage Vgsn of the NMOS transistor 432 in the output buffer 141 and, consequently, the current driving ability of the NMOS transistor 432 is also reduced.

If instead, the resistance of the resistive circuit 900 decreases in response to the first control signal SAVE1 and the second control signal SAVE2, the reference current Iref flowing through the resistive circuit 900 increases. The increased reference current Iref is copied to the first current Iout1 by the current mirror formed of the transistors MP1, MP2, MP3 and MP4. In order to increase the first current Iout1, the gate voltage V1 of the PMOS transistor MP4 should be decreased and the gate voltage V4 of the NMOS transistor MN4 and the gate voltage V3 of the NMOS transistor MN3 should be increased. Additionally, the first current Iout1 is copied to the second current Iout2 by the current mirror formed of transistors MN3 and MN4. In order to increase the second current Iout2, the voltage V2 of the PMOS transistor MP8 should decrease.

Thus, if the resistance of the resistive circuit 900 has decreased in response to the first control signal SAVE1 and the second control signal SAVE2, the bias voltages V1 and V2 decrease while the bias voltages V3 and V4 increase. The increase in the bias voltages V1 and V2 decrease the gate voltage Vgsp of the PMOS transistor 431 in the output buffer 141, whereby the output current from the output buffer 141 is increased. Accordingly, the current driving ability of the PMOS transistor 431 is increased. The bias voltages V3 and V4 increase the gate voltage Vgsn of the NMOS transistor 432 in the output buffer 141 and, consequently, the current driving ability of the NMOS transistor 432 is also increased.

Referring to FIG. 10, the bias voltage generator 420 generates a plurality of bias voltages V1 to Vn (where n=4 in the particular embodiment depicted in FIG. 10). The level of each of the plurality of bias voltages V1 to Vn is controllable based on the combination of the level of the first control signal SAVE1 and the level of the second control signal SAVE2. In the embodiment of FIG. 10, bias voltages V1 and V2 (a first group of bias voltages) increase or decrease together while bias voltages V3 and V4 (a second group of bias voltages) likewise increase or decrease together.

As shown in FIG. 11, a plurality of resistors 901, 903 and 905 are connected between the transistor MN2 and a reference voltage VSS. A transistor 911 is connected between a node 907 and a node 909, and a transistor 913 is connected between the node 909 and the reference voltage VSS. The first control signal SAVE1 is input to the gate of the transistor 913, and the second control signal SAVE2 is input to the gate of the transistor 911. Here, each of the plurality of resistors 901, 903 and 905 has resistance much greater than turn-on resistance of the transistors 911 and 913.

In the first mode, that is, where the first control signal SAVE1 is at a first logic state (for example, a logic 0) and the second control signal SAVE2 is also at the first logic state, the circuit 900 has the highest resistance value and the current driving capability of the buffer 141 is thus reduced. In the second mode, that is, where the first control signal SAVE1 is at a second logic state (for example, a logic 1) and the second control signal SAVE2 is also at the second logic state, the circuit 900 has the lowest resistance value and the current driving capability of the buffer 141 is increased. In the third mode, that is, where the first control signal SAVE1 is at a second logic state (for example, a logic 1) and the second control signal SAVE2 is at the first logic state, the circuit 900 has a medium resistance value and thus, the current driving capability of the buffer 141 is a medium level.

Therefore, the current driving capability of the buffer 141 in the first mode is lower than that of the buffer 141 in the third mode, and the current driving capability of the buffer 141 in the third mode is lower than that of the buffer 141 in the second mode.

FIG. 12 shows a timing diagram of the input/output signals of the control circuit 130 and the output buffer 141 of FIG. 5. Referring to FIG. 3 and FIG. 12, it can be seen that the output buffer 141 has different current driving capabilities in mode 1, mode 2 and mode 3. In particular, by comparing the charge sharing CSR region shown in FIG. 3 and the mode 1 region shown in FIG. 12, it can be seen that the amount of static current OPSCP consumed by the output buffer 141 of FIG. 5 in the mode 1 region of FIG. 12 is much lower than the amount of static current OPSC consumed by the output buffer 41 of FIG. 2 in the charge sharing CSR region of FIG. 3.

Figure 1:
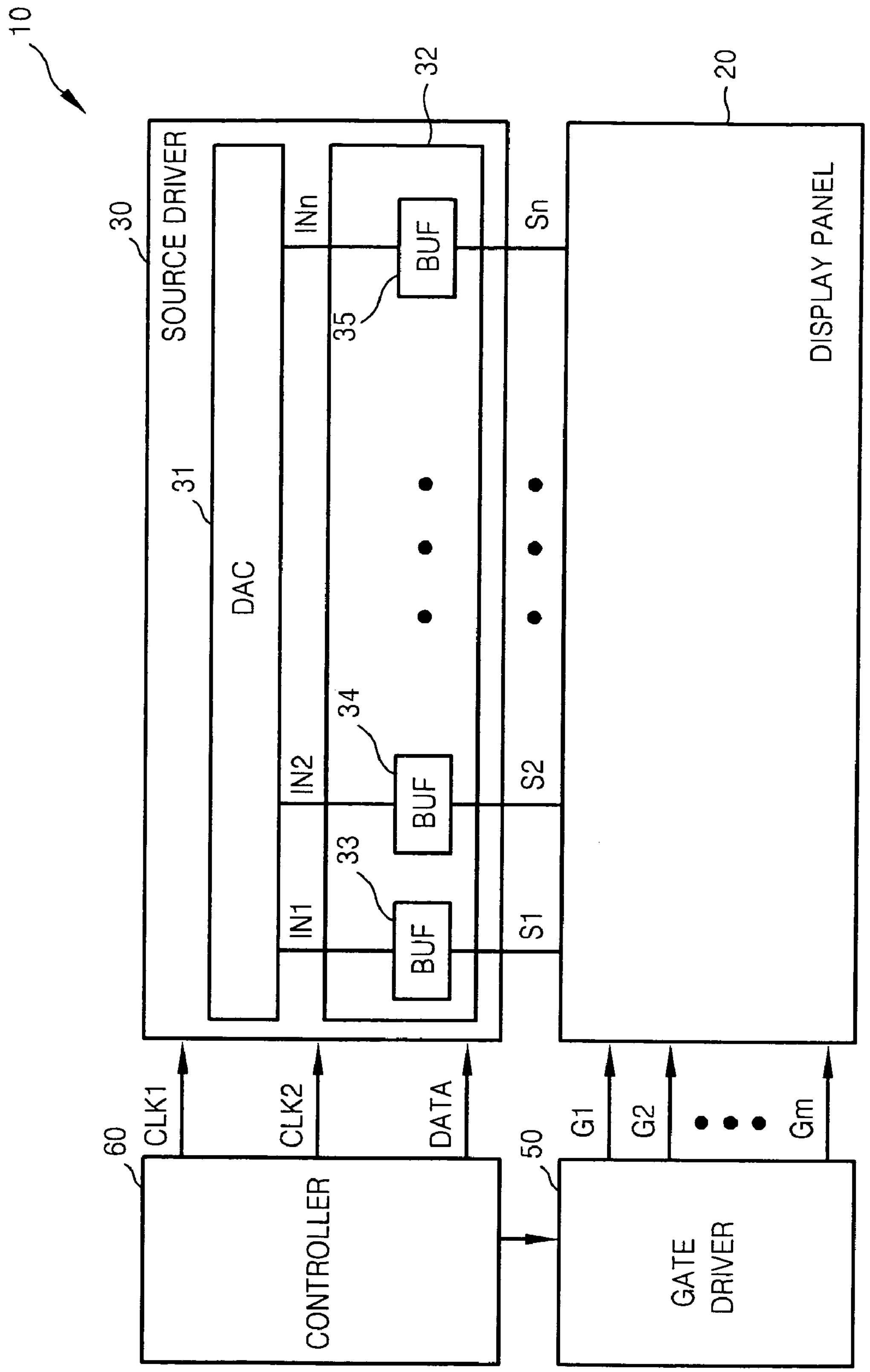
FIG. 1 (PRIOR ART)
FIG. 1 is a block diagram of a conventional prior art display device.
Figure 2:
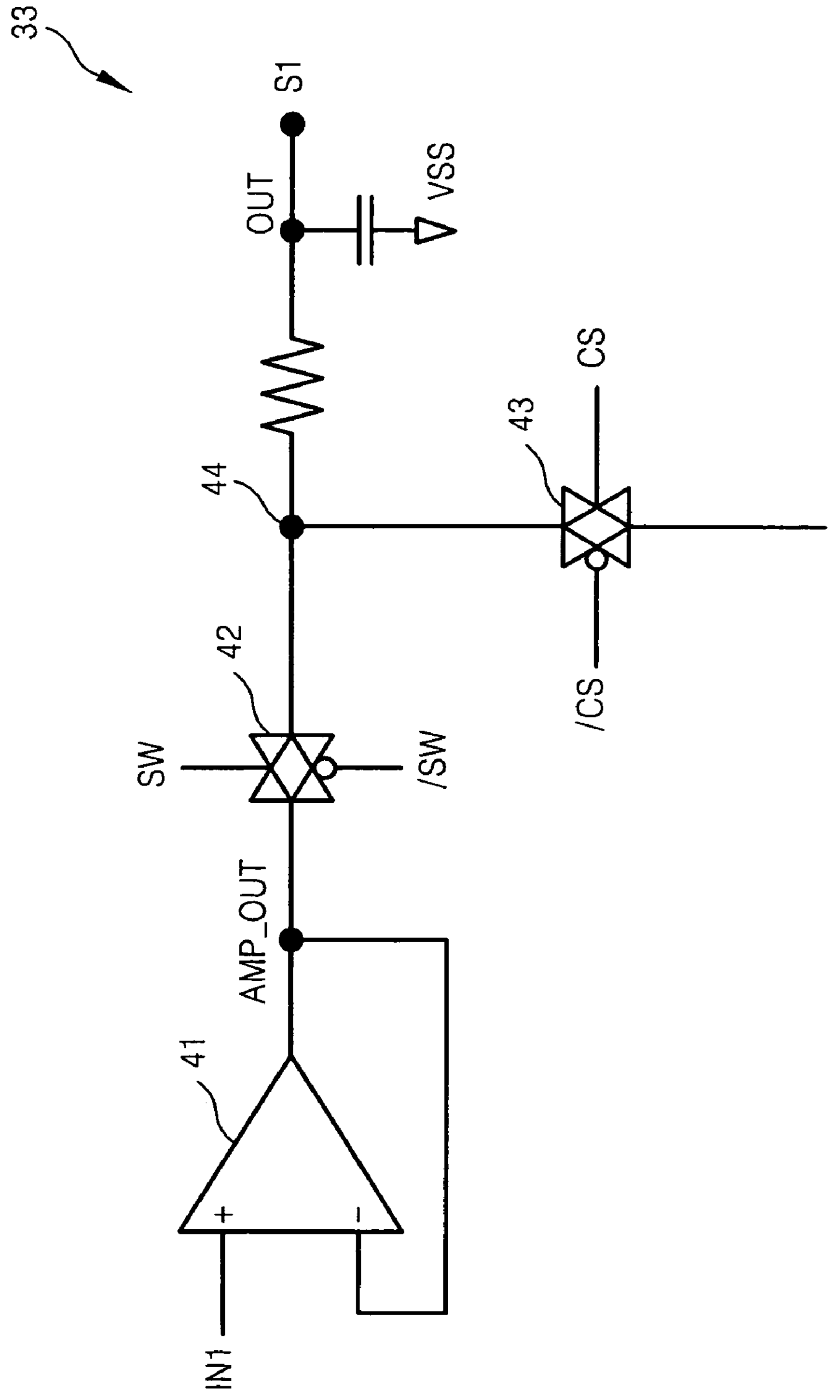
FIG. 2 (PRIOR ART)
FIG. 2 is a circuit diagram of one of the output buffers in the display device of FIG. 1.
Figure 3:
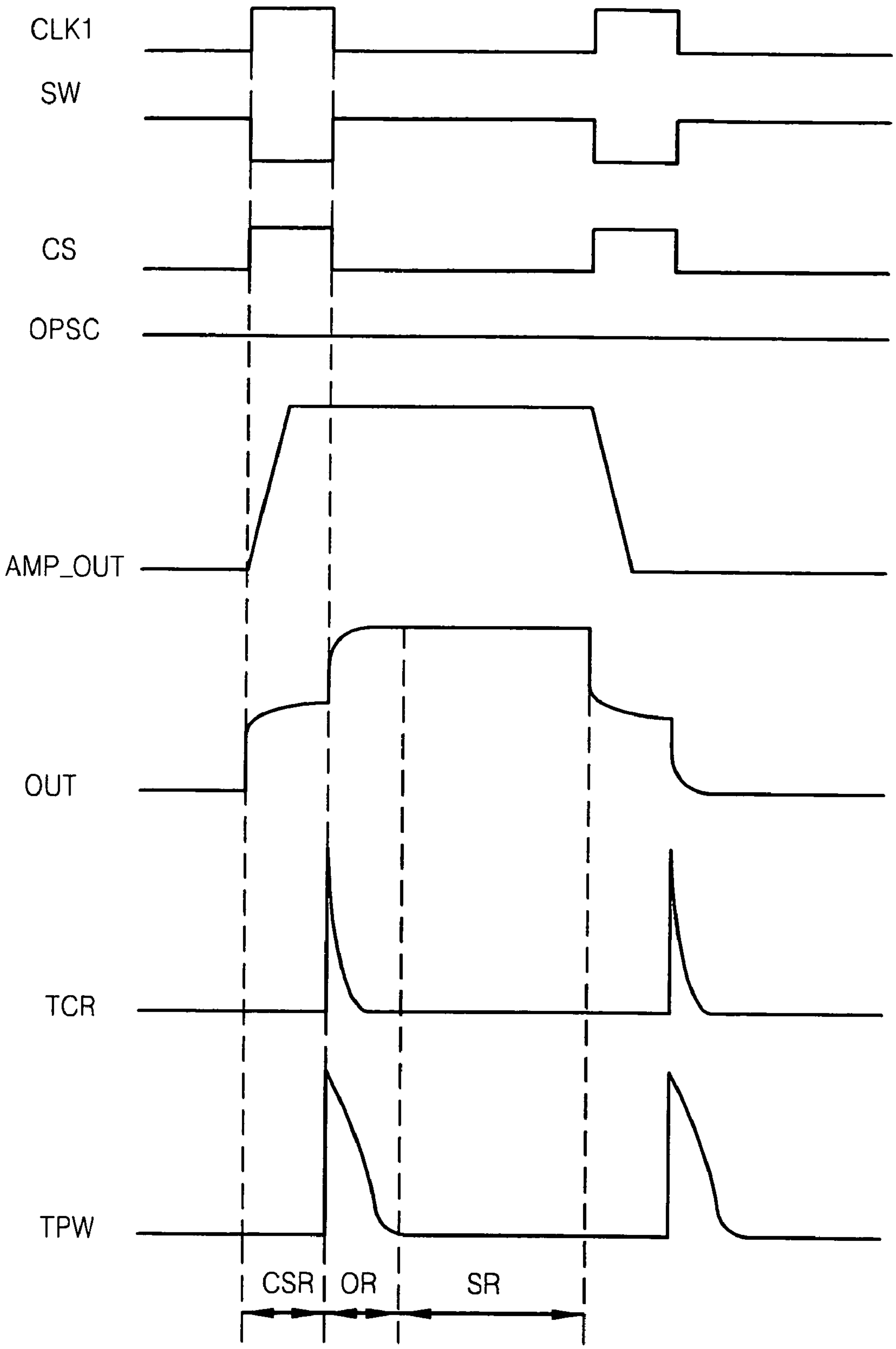
FIG. 3 (PRIOR ART)
FIG. 3 is a timing diagram of the input/output signals of the output buffer of FIG. 2.

Thus, the total current TCRP consumed by the output buffer 141 of FIG. 5 is lower than the total current TCR consumed by the output buffer 41 of FIG. 2. As a result, the total power TPWP consumed by the output buffer 141 may also be considerably reduced as compared to the total power TPW consumed by the output buffer 41. In FIG. 12, 951, 953 and 955 represent the (reduced amount) of the static current OPSCP, the total current TCRP and the total power TPWP, respectively in the CSR region.

Likewise, comparison of the stand-by region SR shown in FIG. 3 and the mode 3 region shown in FIG. 12 shows that the static current OPSCP consumed by the output buffer 141 of FIG. 5 in the mode 3 region of FIG. 12 may be considerably lower than the static current OPSC consumed by the output buffer 41 of FIG. 2 in the stand-by region SR of FIG. 3.

Therefore, the total current TCRP consumed by the output buffer 141 of FIG. 5 is also lower than the total current TCR consumed by the output buffer 41 of FIG. 2, and the total power TPWP consumed by the output buffer 141 may be significantly reduced as compared to the total power TPW consumed by the output buffer 41. In FIGS. 12, 961, 963 and 965 represent the (reduced amount) of the static current OPSCP, the total current TCRP and the total power, respectively in the SR region. Curve 960 of FIG. 12 represents a waveform of the output voltage OUT of the output buffer 33 shown in FIG. 2 and curve 980 represents a waveform of the output voltage OUT of the output buffer 141 shown in FIG. 5.

Figure 13:
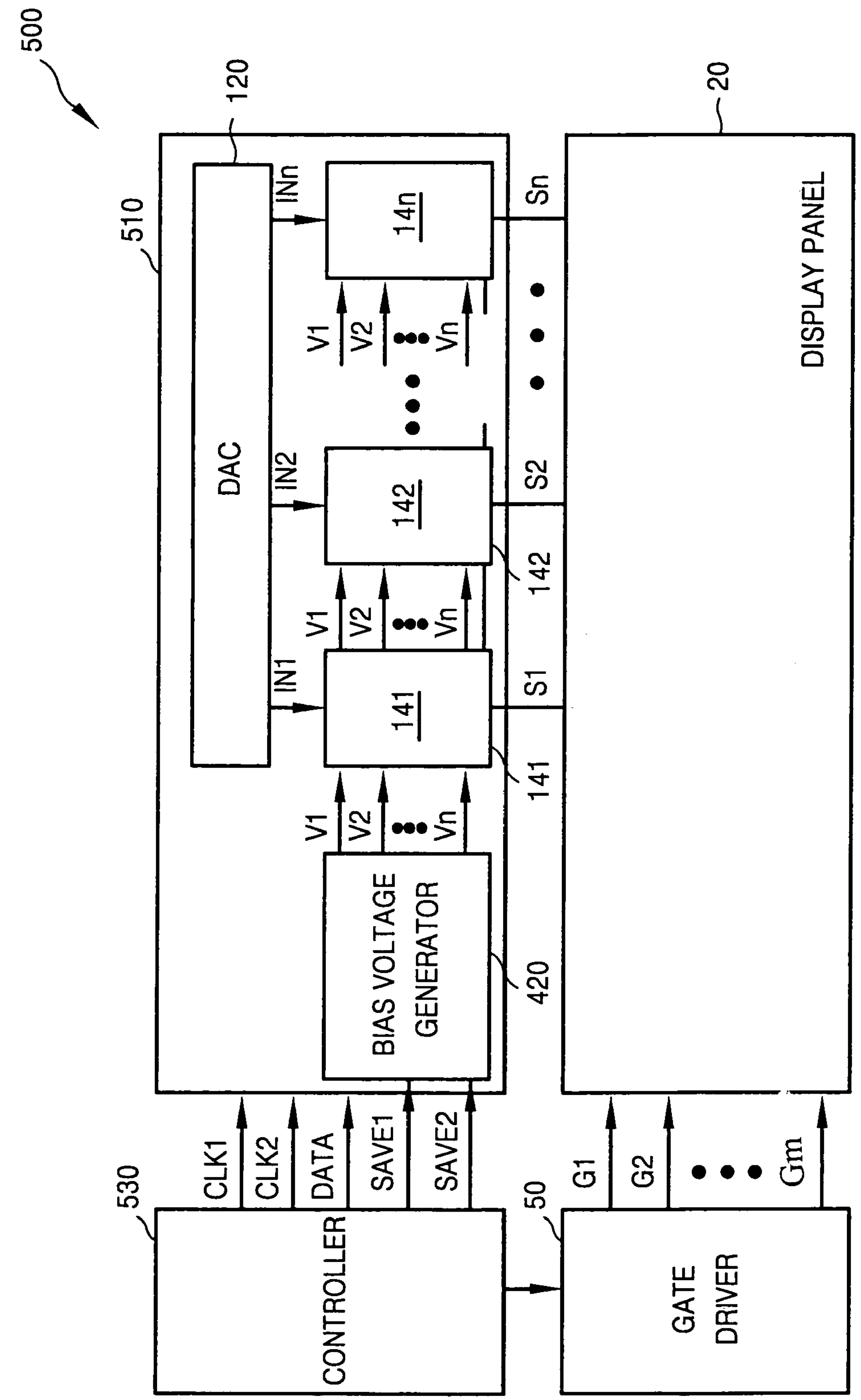
FIG. 13 is a block diagram of a display device according to further embodiments of the present invention.

FIG. 13 is a block diagram of a display device according to further embodiments of the present invention. Referring to FIG. 13, the display device 500 comprises a display panel 20, a source driver 510, a gate driver 50 and a controller 530. The source driver 510 includes a digital-to-analog converter 120, a bias voltage generator 420 and a plurality of buffers 141, 142, . . . **14*n*. The controller 530 outputs a first clock signal CLK1, a second clock signal CLK2, image data DATA, a first control signal SAVE1 and a second control signal SAVE2 to the source driver 510**.

The bias voltage generator 420 of the source driver 510 shown in FIG. 13 generates a plurality of bias voltages V1 to Vn, each level of the plurality of bias voltages V1 to Vn is controlled in response to the first control signal SAVE1 and the second control signal SAVE2 directly output from the controller 530.

The plurality of buffers 141, 142, . . . **14*n* buffer corresponding input signals IN1, IN2, . . . INn based on the plurality of bias voltages V1 to Vn. Each of the buffers 141, 142, . . . 14*n* has its current driving ability controlled on the basis of the plurality of bias voltages V1 to Vn, as described for FIG. 4 to FIG. 12**.

Referring again to FIG. 3, it can be seen that the conventional output buffer 33 consumes a constant current OPSC. The current OPSC may be unnecessary in the charge sharing region CS, and the same amount of current is consumed in both the operating region OR and the standby region SR. In contrast, pursuant to embodiments of the present invention, source drivers and display devices including such source drivers are provided in which the amount of the output current output from the output buffer may be controlled based on control signals output by a control circuit. Accordingly, the power consumed by the output buffer can be reduced. Therefore, in the source driver, and display devices using such source drivers, can have reduced heat generation.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A source driver comprising:

a buffer that is configured to receive an input signal; and a control circuit coupled to the buffer that is configured to control an output current level of the buffer, wherein the control circuit comprises a bias voltage generator that is configured to generate a plurality of bias voltages in response to a plurality of control signals, and wherein the output current level of the buffer is controlled based on the plurality of bias voltages, and wherein each of the plurality of control signals is generated in response to a respective one of a plurality of clock signals, and wherein each of the plurality of clock signals has a different frequency.

2. The source driver of claim 1, wherein the plurality of bias voltages are generated by the bias voltage generator in response to the plurality of control signals, wherein the plurality of control signals include a first control signal and a second control signal.

3. The source driver of claim 1, wherein the control circuit sets the output current level of the buffer to different levels in at least two of a charge sharing region, an operating region and a standby region of the driving cycle of the source driver.

4. The source driver of claim 3, wherein the control circuit sets the output current level of the buffer to different levels in each of the charge sharing region, the operating region and the standby region of the driving cycle of the source driver.

5. The source driver of claim 2, wherein the output current level of the buffer when the first control signal is a first logic state and the second control signal is the first logic state is lower than the output current level of the buffer when the first control signal is a second logic state and the second control signal is the first logic state, and wherein the output current level of the buffer when the first control signal is the second logic state and the second control signal is the first logic state is lower than the output current level of the buffer when the first control signal is the second logic state and the second control signal is the second logic state.

6. The source driver of claim 1, wherein the buffer comprises:

a pull-up transistor connected to a first reference voltage and an output terminal of the buffer; and a pull-down transistor connected between the output terminal of the buffer and a second reference voltage, wherein a current driving capability of the pull-up transistor is controlled by the bias voltages of a first subset of the plurality of bias voltages and a current driving capability of the pull-down transistor is controlled by the bias voltages of a second subset of the plurality of bias voltages.

7. The source driver of claim 2, wherein the plurality of clock signals includes a first clock signal and a second clock signal, and wherein the control circuit further comprises:

a first control signal generating circuit that is configured to generate the first control signal based on the first clock signal and a delay signal that delays the first clock signal for a predetermined time; and a second control signal generating circuit that is configured to generate the second control signal based on the first clock signal and the second clock signal.

8. The source driver of claim 7, wherein the first control signal generating circuit comprises:

a delay circuit that is configured to receive the first clock signal and output the delay signal;

an inverter that is coupled to the output of the delay circuit; and a NAND circuit that is configured to perform a NAND operation on the first clock signal and an output signal of the inverter to generate the first control signal, and wherein the second control signal generating circuit comprises:

a counter that is configured to count cycles of the second clock signal; and an OR circuit that is configured to perform an OR operation on the first clock signal and an output signal of the counter to generate the second control signal.

9. The source driver of claim 7, wherein a frequency of the first clock signal is lower than a frequency of the second clock signal.

10. A method for controlling an amount of output current from an output buffer of a source driver comprising:

generating a plurality of bias voltages, wherein the level of each of the plurality of bias voltages is controlled in response to a first control signal and a second control signal;

buffering an input signal generated from image data based on the plurality of bias voltages; and controlling the amount of output current from the output buffer based on the plurality of bias voltages, and wherein the first control signal and the second control signal are generated in response to a plurality of clock signals, and wherein each of the plurality of clock signals has a different frequency.

* * * * *